Figure 1:
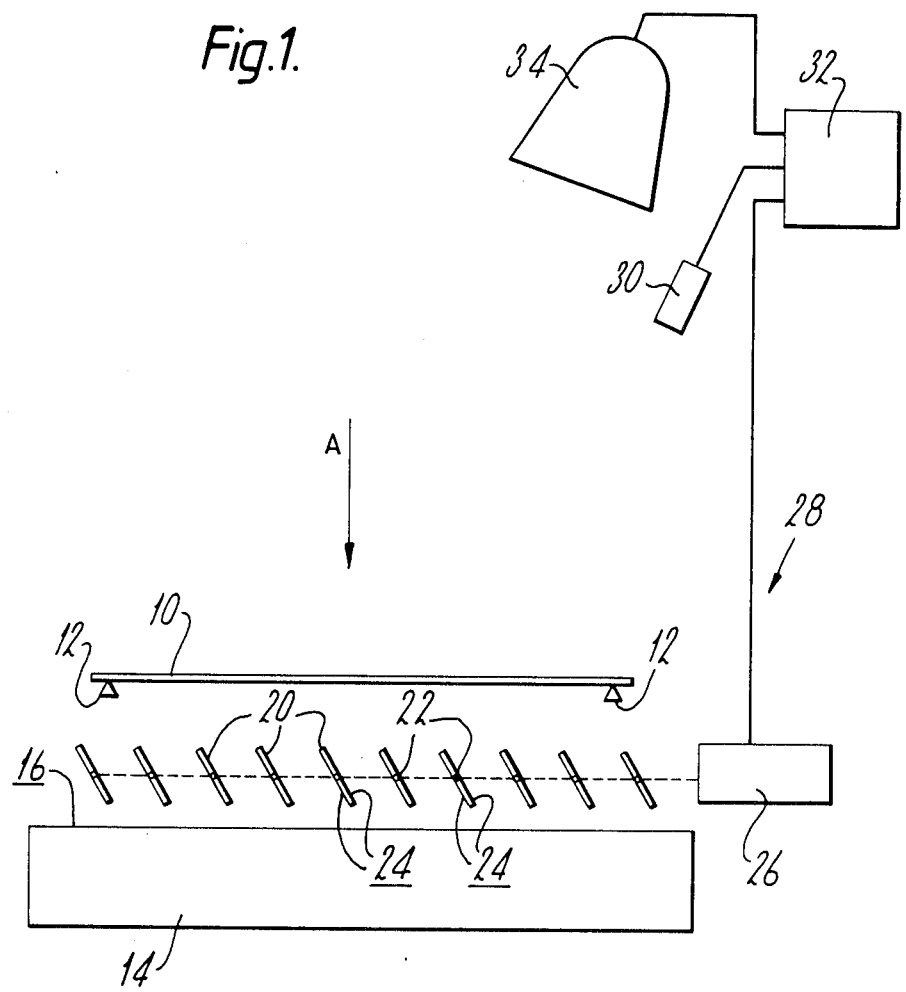

United States Patent [19]

Marwick et al.

[11] Patent Number: 4,619,030
[45] Date of Patent: Oct. 28, 1986

[54] TEMPERATURE CONTROL

[75] Inventors: Alan D. Marwick, Katonah, N.Y.; Harry C. Sansom, deceased, late of Newbury, England, by Janet Mary Sansom, administratrix

[73] Assignee: United Kingdom Atomic Energy Authority, London, England

[21] Appl. No.: 753,336

[22] Filed: Jul. 9, 1985

[30] Foreign Application Priority Data

Jul. 16, 1984 [GB] United Kingdom ............... 8418062

[51] Int. Cl.[4] .................... B23Q 15/00; F28F 27/00
[52] U.S. Cl. ...................................... 29/404; 29/405;
29/407; 29/709; 29/714; 62/383; 236/3;
165/904; 165/96
[58] Field of Search ............... 29/404, 405, 407, 709,
29/714, 720; 236/3, 6, 1 R; 165/904, 96, 26, 30;
62/383; 432/24, 37, 36

[56] References Cited

U.S. PATENT DOCUMENTS

| 3,062,941 | 11/1962 | White | 236/6 |
| 3,139,881 | 7/1964 | Fannon | 236/6 |
| 3,174,537 | 3/1965 | Meyer | 165/30 |
| 3,225,820 | 12/1965 | Riordan | 62/383 |
| 3,682,643 | 8/1972 | Foster | 165/30 |
| 4,319,125 | 3/1982 | Prince | 165/904 |

Primary Examiner—Howard N. Goldberg
Assistant Examiner—Irene Golabi
Attorney, Agent, or Firm—William R. Hinds

[57] ABSTRACT

During treatment of a specimen (10) in an evacuated chamber, the temperature of the specimen is controlled by varying the radiant heat flux to and from the specimen. The specimen is supported adjacent to but spaced apart from a heat sink (14) with a blackened surface (16), and between the specimen (10) and the heat sink (14) are one or more reflective elements (20) movable so as to cover a larger or a smaller fraction of the surface of the heat sink.

8 Claims, 2 Drawing Figures

TEMPERATURE CONTROL

The present invention relates to a method and an apparatus for controlling the temperature of a specimen undergoing treatment in an evacuated chamber.

In the production of semiconductor devices, silicon wafers may be treated with a beam of ions in an evacuated chamber to bring about a desired modification of the surface. During such treatment heat is generated in the wafer, and this heat may have to be transmitted to the surroundings if an unacceptable temperature rise is to be avoided.

According to the present invention there is provided an apparatus for controlling the temperature of a specimen undergoing treatment in an evacuated chamber, the apparatus comprising means to support the specimen, at least one heat sink adjacent to but spaced from the specimen, and means situated between the specimen and the heat sink for varying the rate of heat transfer therebetween by radiation.

Preferably the heat sink has a surface facing the specimen with a high emissivity in the range of wavelengths emitted by the specimen, as this maximises the rate of absorption of thermal radiation by the heat sink. The radiation varying means may comprise a plurality of elements, each element having a surface highly reflective to thermal radiation, the elements being movable so as to cover a larger or smaller fraction of the high emissivity surface of the heat sink. In one embodiment the movable elements are thin vanes, rotatable between orientations perpendicular or parallel to the surface of the heat sink.

In a second embodiment the support means is rotatable so as to cause the specimen to pass repeatedly through the region at which the treatment occurs, and to pass repeatedly adjacent to but spaced from the heat sink, and the radiation varying means comprises a vane with a surface highly reflective to thermal radiation, the vane being movable so as to cover a larger or smaller fraction of the high emissivity surface of the heat sink. The support means may be a hollow cylindrical drum rotatable about its longitudinal axis, and concentric cylindrical heat sinks may be provided both inside and outside the drum.

The apparatus may include means for exposing the specimen to thermal radiation so as to raise its temperature.

The invention also provides a method for controlling the temperature of a specimen undergoing treatment in an evacuated chamber, the method comprising supporting the specimen adjacent to but spaced from a heat sink, and varying the effective thermal emissivity of the surface of the heat sink onto which radiation from the specimen is incident in relation to the temperature of the specimen.

Figure 2:
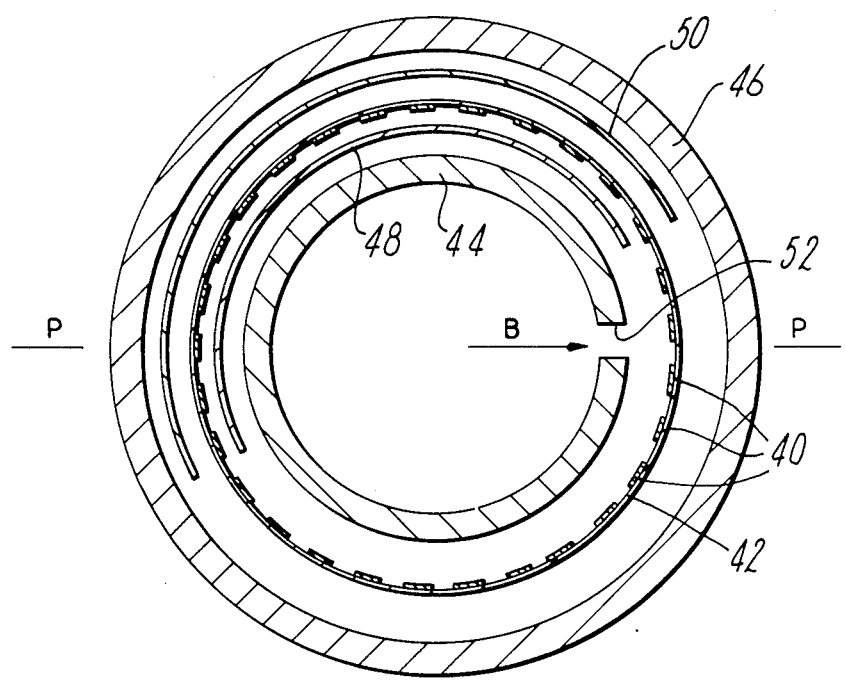

The invention will now be described by way of example only and with reference to the accompanying drawings, in which:

FIG. 1 shows a diagrammatic side elevation of an apparatus for treating a silicon wafer, including a temperature control apparatus; and FIG. 2 shows a diagrammatic cross-sectional view of an alternative wafer treatment apparatus including a temperature control apparatus.

Referring to FIG. 1, a silicon wafer 10 is shown supported by two supports 12 in an evacuate chamber (not shown), so as to be irradiated by an oxygen ion beam A incident in the downwards direction. During treatment of the wafer 10, the ion beam A is scanned over the surface of the wafer 10, causing an increase in temperature, and embedding oxygen atoms in the wafer 10. The temperature is preferably maintained constant to within about 10K, at a value of about 500° C.

The wafer 10 is supported above a heat sink 14 whose upper surface 16 is blackened so as to have a high emissivity to infra-red radiation. The heat sink 14 is cooled by a coolant liquid. Between the wafer 10 and the surface 16 of the heat sink 14 are a number of rectangular vanes 20 aligned parallel to each other and pivoted about parallel shafts 22. Both surfaces 24 of each vane 20 are made to be shiny and highly reflective to infra-red radiation. A drive mechanism 26 (shown diagrammatically) is connected to all the shafts 22 so as to rotate all the vanes 20 in unison to any desired orientation between perpendicular to and parallel to the surface 16 of the heat sink 14. The vanes 20 are of such a width that when parallel to the surface 16 of the heat sink 14 there are no gaps between adjacent vanes 20.

The heat sink 14, the vanes 20 and the drive mechanism 26 are components of a temperature control apparatus 28 which also includes an infra-red detector 30 for measuring the temperature of the wafer 10, and a computer 32 connected to the detector 30 and to the drive mechanism 26. A lamp 34 is also connected to the computer 32.

In operation, a wafer 10 is placed on the supports 12 and by means of the lamp 34 is heated initially to the desired temperature. Bombardment by the ion beam is then commenced, and the orientation of the vanes 20 is controlled by the computer 32 in accordance with the temperature of the wafer 10 as measured by the detector 30, so as to maintain the desired temperature. When the vanes 20 are oriented perpendicular to the surface 16 of the heat sink 14 they have minimal effect on the radiant heat flux from the wafer 10 to the surface 16 of the heat sink 14, whereas when oriented parallel to the surface 16 of the heat sink 14 they substantially prevent any radiant heat flux. The rate of heat loss from the lower surface of the wafer 10 can therefore be controlled by rotation of the vanes 20, and hence a constant temperature maintained.

It will be appreciated that although the apparatus 28 includes rotatable vanes 20, an alternative temperature control apparatus may include alternative means for providing a reflective barrier of variable effective area between the wafer 10 and the heat sink 14; for example two plane reflective gratings slidable with respect to each other, the reflective portions of the one grating being complementary to that of the other grating.

Referring now to FIG. 2, a large number of silicon wafers 40 are supported on the inside surface of a cylindrical hollow drum 42 which in use is rotated so as to pass the wafers 40 repeatedly through the path of an ion beam B. The beam B is thus effectively scanned over a large area—the whole inner surface of the drum 42—and the mean power received by any one wafer 40 is consequently less than with the apparatus of FIG. 1. The temperature of any one of the wafers 40, at equilibrium, is such that the energy gained during its passage through the ion beam B is lost to the surroundings by radiation during the rest of the revolution of the drum 42, and so the equilibrium temperature depends on the average thermal emissivity of all the surfaces adjacent to which the wafer 40 passes during a revolution of the drum 42.

The temperature is controlled by means of two stationary cylindrical heat sinks 44 and 46, concentric with the drum 42 and respectively inside and outside the drum 42; and two half-cylindrical vanes 48 and 50, pivotably supported in the annular gaps between the drum 42 and the heat sink 44 or 46 respectively. The heat sinks 44 and 46 are maintained at a substantially constant temperature by passing a coolant fluid through them. The ion beam B emerges through a slot 52 in the wall of the inner heat sink 44. The surfaces of the heat sinks 44 and 46 facing the drum 42 below the horizontal plane P—P are blackened so as to provide surfaces with high emissivity at the wavelengths emitted by the drum 42 and the wafers 40; while the heat sink surfaces facing the drum 42 above the plane P—P are polished so as to provide low emissivity surfaces. The surfaces of the vanes 48 and 50 facing the drum 42 are polished, while the surfaces of the vanes 48 and 50 facing the respective heat sink 44 or 46 are blackened. The vanes 48 and 50 are supported by a common shaft (not shown) so as to be turnable together through about 180° between a position at which they shield the drum 42 and the wafers 40 from the blackened lower half of the heat sinks 44 and 46, to a position at which the blackened surfaces of the heat sinks 44 and 46 are fully exposed.

Typical values for the total emissivity of blackened and polished surfaces are 0.8 and 0.1 respectively, and thus in operation of the apparatus of FIG. 2 the average emissivity of the surfaces adjacent to which a wafer 40 passes in each revolution of the drum 42 can be varied between about 0.1 and 0.5 by moving the vanes 48 and 50 between their extreme positions. Movement of the vanes 48 and 50 is brought about in dependance on the wafer temperature as measured by an infra-red detector (not shown), the control system being similar to that described above with reference to FIG. 1.

It will be appreciated that if the ion beam B is of non-uniform intensity across its width i.e. parallel to the axis of rotation of the drum 42, non-uniformity of temperature of the wafers 40 may be compensated for by having appropriately curved leading and trailing edges to the half-cylindrical vanes 48 and 50.

We claim:

1. An apparatus for controlling the temperature of a specimen undergoing treatment in an evacuated chamber, the apparatus comprising means to support the specimen, at least one heat sink adjacent to but spaced from the specimen, and means situated between the specimen and the heat sink for varying the rate of heat transfer therebetween by radiation.

2. An apparatus as claimed in claim 1 wherein the heat sink has a surface facing the specimen with a high emissivity in the range of wavelengths emitted by the specimen.

3. An apparatus as claimed in claim 2 wherein the radiation varying means comprises at least one movable element, each element having a surface highly reflective to thermal radiation, and being movable so as to cover a larger or smaller fraction of the surface of the heat sink.

4. An apparatus as claimed in claim 3 comprising a plurality of movable elements, the movable elements being thin vanes, rotatable between orientations perpendicular or parallel to the surface of the heat sink.

5. An apparatus as claimed in claim 3 wherein the support means is rotatable so as to cause the specimen to pass repeatedly through the region at which the treatment occurs, and to pass repeatedly adjacent to but spaced from the heat sink.

6. An apparatus as claimed in claim 5 wherein the support means comprises a hollow cylindrical drum rotatable about its longitudinal axis, and concentric cylindrical heat sinks are provided both inside and outside the drum.

7. An apparatus as claimed in claim 1 also comprising means for exposing the specimen to thermal radiation so as to raise its temperature.

8. A method for controlling the temperature of a specimen undergoing treatment in an evacuated chamber, the method comprising supporting the specimen adjacent to but spaced from a heat sink, and varying the effective thermal emissivity of the surface of the heat sink onto which radiation from the specimen is incident in relation to the temperature of the specimen.

* * * * *